US010077839B2

(12) United States Patent
Ooshiro et al.

(10) Patent No.: US 10,077,839 B2
(45) Date of Patent: Sep. 18, 2018

(54) PISTON RING AND PROCESS FOR PRODUCING SAME (71) Applicant: HONDA MOTOR CO., LTD., Tokyo (JP)

(72) Inventors: Takehiko Ooshiro, Kyoto (JP); Koji Miyake, Kyoto (JP); Satoshi Yoshida, Wako (JP); Eishi Fujimagari, Wako (JP); Takeyuki Yamasaki, Wako (JP); Hidetoshi Chiba, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/116,883

(22) PCT Filed: Feb. 13, 2014

(86) PCT No.: PCT/JP2014/053327
§ 371 (c)(1),
(2) Date: Aug. 5, 2016

(87) PCT Pub. No.: WO2015/121944
PCT Pub. Date: Aug. 20, 2015

(65) Prior Publication Data
US 2017/0167608 A1 Jun. 15, 2017

(51) Int. Cl.
*F16J 9/26* (2006.01)
*C23C 16/26* (2006.01)
(Continued)

(52) U.S. Cl.
CPC ............. *F16J 9/26* (2013.01); *C23C 14/0036* (2013.01); *C23C 14/025* (2013.01);
(Continued)

(58) Field of Classification Search
CPC . F16J 9/26; F16J 9/00; C23C 14/0036; C23C 14/025; C23C 14/0605;
(Continued)

(56) References Cited

U.S. PATENT DOCUMENTS 5,255,433 A * 10/1993 Jin .................. C22C 1/1094
164/97
2002/0175476 A1 11/2002 Chinou et al.
(Continued)

FOREIGN PATENT DOCUMENTS

CN 101100963 A 1/2008
CN 102597191 A 7/2012
(Continued)

OTHER PUBLICATIONS

Chinese Office Action and Search Report for Application No. 201480074734.2, dated Jan. 3, 2018, with a partial English translation of the Office Action.
(Continued)

*Primary Examiner* — Nathan Cumar
(74) *Attorney, Agent, or Firm* — Birch, Stewart, Kolasch & Birch, LLP (57) ABSTRACT Provided are a piston ring which, even when a sleeve constituted of an aluminum alloy is used, can sufficiently show the required low frictional properties, wear resistance, and low counterpart-material attacking properties, and a process for producing the piston ring. The piston ring has a rigid carbon film formed as the outermost layer thereof and serving as a sliding surface with a sleeve constituted of an aluminum alloy, wherein the rigid carbon film gives an X-ray diffraction pattern that has peaks assigned to graphite crystals. The rigid carbon film of the piston ring is formed using a chemical vapor deposition method. The rigid carbon film of the piston ring has a hydrogen content which is at
(Continued)

least 20 atm % but lower than 30 atm %, and gives a Raman spectrum in which the ratio of the area (ID) of D-band peaks to the area (IG) of G-band peaks, ID/IG, is 0.5-2.0.

4 Claims, 9 Drawing Sheets

(51) Int. Cl.
    *C23C 16/02*     (2006.01)
    *C23C 16/50*     (2006.01)
    *C23C 14/00*     (2006.01)
    *C23C 14/02*     (2006.01)
    *C23C 14/06*     (2006.01)

(52) U.S. Cl.
    CPC ...... *C23C 14/0605* (2013.01); *C23C 16/0272* (2013.01); *C23C 16/0281* (2013.01); *C23C 16/26* (2013.01); *C23C 16/50* (2013.01)

(58) Field of Classification Search
    CPC ..... C23C 16/0281; C23C 16/26; C23C 16/50; C23C 14/00; C23C 16/00
    USPC .......................................................... 277/443
    See application file for complete search history.

(56) References Cited

U.S. PATENT DOCUMENTS

2008/0007006 A1    1/2008    Kawai
2012/0177915 A1*   7/2012    Kasai ................... C10M 141/10
                                                                            428/336
2012/0308949 A1*  12/2012    Hirose ................ C23C 16/0272
                                                                            432/52
2013/0302693 A1*  11/2013    Sun ........................ H01M 4/625
                                                                           429/231.8
2013/0328274 A1    12/2013    Sugiura et al.
2014/0323368 A1*  10/2014    Avelar Araujo ...... C23C 14/024
                                                                           508/105

FOREIGN PATENT DOCUMENTS

| CN | 103403409 A | 11/2013 |
|---|---|---|
| EP | 1 783 349 A1 | 5/2007 |
| JP | 2006-22666 A | 1/2006 |
| JP | 2006-57674 A | 3/2006 |
| JP | 2006-206978 A | 8/2006 |
| JP | 2010-202945 A | 9/2010 |
| JP | 102758201 A | 10/2012 |
| WO | WO 2011/034026 A1 | 3/2011 |

OTHER PUBLICATIONS

Chinese Office Action and Search Report, dated Apr. 28, 2017, for Chinese Application No. 201480074734.2, with a partial English translation.
International Search Report for PCT/JP2014/053327 dated May 20, 2014.

\* cited by examiner

PISTON RING AND PROCESS FOR PRODUCING SAME

TECHNICAL FIELD

The present invention relates to a piston ring used, for example, for automobile engines, and more particularly, to a piston ring to be used with a sleeve made of aluminum alloy and serving as a mating member and to a process for producing the piston ring.

BACKGROUND ART

Piston rings are mounted on pistons in engines on automobiles, for example. A piston ring slides with the wall face of a sleeve (cylinder) serving as a mating member. Hence, the piston ring is required to have low friction properties, high abrasion resistance and low aggressiveness to the mating member.

Conventionally, the sleeve serving as a mating member has been frequently made of cast iron, and the surface of the piston ring has been surface-treated; for example, a CrN (chromium nitride) film or a hydrogen-free hard carbon film (Diamond Like Carbon film: DLC film) is formed on the surface of the piston ring to provide the piston ring with the above-mentioned low friction properties, high abrasion resistance and low aggressiveness to a mating member.

However, in recent years, requests for improving the efficiency of engines and reducing the weights of engines from users have become strong. Hence, it has been examined that, instead of the cast iron having been used conventionally, aluminum alloy in which 15 atm % or more of Si is contained and to which Fe and Mn, for example, are added to enhance strength is adopted as the material of the sleeve.

However, as the result of the examination on the sleeve made of the aluminum alloy described above, it has been found that, in the case of piston rings having surfaces described below, the following problems will occur which correspond to the surfaces described below respectively.

First, in the case of a nitrided piston ring, there is a problem that the piston ring has insufficient adhesion suppression effect although the hardness of the piston ring increases. Furthermore, in the case of a piston ring having a CrN film formed on its surface, there is a problem that the piston ring is liable to cause adhesion to aluminum.

Further, in the case of a piston ring having a hydrogen-free DLC film formed on its surface, there is a problem that the piston ring exhibits high aggressiveness to a mating member and the abrasion amount of the sleeve made of aluminum alloy becomes very large although the piston ring exhibits high abrasion resistance because of its high hardness.

Still further, in the case of a piston ring having a hydrogen-containing DLC film formed on its surface, there is a problem that the abrasion amount of the hydrogen-containing DLC film becomes large because the film has low hardness although the abrasion amount of the sleeve made of aluminum alloy is very small because the hydrogen-containing DLC film has a low friction coefficient and low aggressiveness to a mating member. In particular, in the case that the above-mentioned sleeve made of aluminum alloy in which Si is contained to increase strength is used as a mating member, the abrasion amount of the hydrogen-containing DLC film becomes very large.

Under these circumstances, it has been proposed that an intermediate layer and a hydrogen-free DLC film are provided on the surface of a piston ring sliding with a sleeve made of aluminum alloy to improve abrasion resistance and scuffing resistance (for example, refer to Patent Document 1).

PRIOR ART DOCUMENT

Patent Document

[Patent Document 1] JP-A-2006-57674

SUMMARY OF THE INVENTION

Problem to be Solved by the Invention

However, in the case of the piston ring to which the above-mentioned technology is applied, low friction properties, high abrasion resistance and low aggressiveness to a mating member, required for the piston ring, in the case that a sleeve made of aluminum alloy is used, are not yet sufficiently satisfied.

Hence, the present invention is to provide a piston ring capable of sufficiently exhibiting low friction properties, high abrasion resistance and low aggressiveness to a mating member, required for the piston ring, even in the case that a sleeve made of aluminum alloy is used, and to also provide a process for producing the piston ring.

Means for Solving the Problem

As a result of earnest examination, the inventors of the present invention have found that the above-mentioned problems can be solved by the invention described in the following claims, thereby completing the present invention. The respective claims will be described below.

The invention uncludes:

a piston ring, on the uppermost layer of which a hard carbon film is formed, the uppermost layer being used as a face sliding with a sleeve made of aluminum alloy, wherein the hard carbon film has graphite crystal peaks in the X-ray diffraction pattern thereof.

The fact that the hard carbon film (DLC film) has graphite crystal peaks in the X-ray diffraction pattern indicates that graphite microcrystals are dispersedly contained in the amorphous portions of the DLC film. Since the graphite microcrystals having high hardness are dispersed in the amorphous portions of the hydrogen-containing hard carbon film having low hardness as described above, the graphite microcrystals exhibit an effect similar to that of nanofillers. Hence, the abrasion amount of the DLC film during sliding is reduced and the abrasion resistance of the DLC film is improved, unlike the case of a general-use hydrogen-containing DLC film having low hardness and being liable to be abraded largely. Furthermore, since the amorphous portions are abraded appropriately, the friction with a mating member is reduced, whereby the DLC film can exhibits excellent low friction properties. Moreover, the hydrogen-containing DLC film has low aggressiveness to a mating member as described above.

Hence, even in the case that the piston ring, on the uppermost layer of which the above-mentioned hydrogen-containing DLC film is formed, is slid with a sleeve made of aluminum alloy, the piston ring can sufficiently exhibit low friction properties, high abrasion resistance and low aggressiveness to a mating member, required for the piston ring.

The invention also includes:

the piston ring wherein the hard carbon film is formed by a chemical vapor deposition method.

A physical vapor deposition method (PVD method) and a chemical vapor deposition method (CVD method) are available as methods for forming DLC films. In the case that the PVD method is adopted, since clusters are scattered and droplets are generated from solid carbon, the surface roughness of the DLC film becomes large and aggressive abrasion is liable to occur, and there is a risk that aggressiveness to a mating member may become high.

On the other hand, in the case that the CVD method is adopted, a DLC film having small surface roughness and capable of exhibiting satisfactory tribology characteristics is formed, whereby the abrasion of a sleeve made of aluminum alloy can be suppressed sufficiently.

The invention also includes:

the piston ring wherein the hydrogen content of the hard carbon film is 20 atm % or more and 30 atm % or less, and the ID/IG ratio between the peak area ID of the D band and the peak area IG of the G band in the Raman spectroscopic spectrum of the hard carbon film is 0.5 or more and 2.0 or less.

If the hydrogen content in the DLC film is too small, the DLC film has high hardness and is excellent in abrasion resistance, but has a high friction coefficient and high aggressiveness to a mating member. On the other hand, if the hydrogen content is too large, the DLC film has a low friction coefficient and low aggressiveness to a mating member, but the film has low hardness and its abrasion resistance lowers. The hydrogen content preferable for sufficiently low friction properties, high abrasion resistance and low aggressiveness to a mating member is 20 atm % or more and 30 atm % or less, and further preferably, 23 atm % or more and 28 atm % or less.

Furthermore, if the ID/IG ratio between the peak area ID of the D band and the peak area IG of the G band in the Raman spectroscopic spectrum of the DLC film is too large, the DLC film has a low friction coefficient and low aggressiveness to a mating member, but the film has low hardness and its abrasion resistance lowers remarkably. On the other hand, if the ID/IG ratio is too small, the DLC film has high hardness and is excellent in abrasion resistance, but has a high friction coefficient and high aggressiveness to a mating member. The ID/IG ratio preferable for sufficiently low friction properties, high abrasion resistance and low aggressiveness to a mating member is 0.5 or more and 2.0 or less.

The invention also includes:

the piston ring wherein the diameter of the graphite microcrystals is 15 to 100 nm.

In the case that the diameter of the graphite crystals is too large, the surface roughness of the DLC film becomes large and its flatness is impaired, whereby the DLC film has a high friction coefficient and low abrasion resistance. On the other hand, in the case that the diameter is too small, the DLC film cannot exhibit preferable tribology characteristics and has difficulty in obtaining sufficiently low friction properties. The preferable diameter of the graphite crystals is 15 to 100 nm.

The invention also includes:

the piston ring wherein a metal layer or a metal nitride layer mainly containing any one metal selected from titanium, tungsten, chromium and silicon is formed as an adhesion layer on the lower layer of the hard carbon film, and the hard carbon film is formed by a cathode PIG plasma CVD method.

The metal layer or metal nitride layer mainly containing titanium (Ti), tungsten (W), chromium (Cr) or silicon (Si) has excellent adhesion properties for both the base member and the DLC film of the piston ring. The phrase "mainly containing" means that the content of each element is 50 atm % or more.

The cathode PIG (Penning Ionization Gauge) plasma CVD method is a method of forming a film by generating plasma using DC discharge and decomposing raw material gas into active atoms, molecules and ions at high efficiency using this plasma. At the time of the film forming, the generated atoms, molecules and ions are deposited on the base member by the application of DC pulses to the base member while the base member is irradiated with the generated atoms, molecules and ions with high energy, whereby a DLC film excellent in adhesion properties can be formed.

The inventors of the present invention have found that, when the hydrogen-containing DLC film is formed by the cathode PIG plasma CVD method, graphite microcrystals can be easily dispersed into the hydrogen-containing DLC film being amorphous by appropriately adjusting the film forming conditions, whereby a hydrogen-containing DLC film having excellent sliding characteristics and high durability can be formed.

The invention includes:

a process for producing a piston ring having a sliding face sliding with a sleeve made of aluminum alloy on the surface thereof, wherein a hard carbon film having graphite crystal peaks in the X-ray diffraction pattern thereof is formed on the uppermost layer of the sliding face.

As the graphite microcrystals are dispersedly contained in the amorphous portions of the DLC film having the graphite crystal peaks in the X-ray diffraction pattern, the DLC film being formed on the uppermost layer of the sliding face as described above, the abrasion resistance of the DLC film can be improved and the DLC film can exhibit excellent low friction properties and has low aggressiveness to a mating member. Hence, a piston ring suitable for the sliding with a sleeve made of aluminum alloy can be obtained by forming this kind of DLC film on the uppermost layer.

The diameter of the graphite microcrystals in the DLC film is preferably 15 to 100 nm.

The invention also includes:

the process for producing a piston ring wherein the hard carbon film is formed by a chemical vapor deposition method.

A DLC film having small surface roughness and capable of exhibiting satisfactory tribology characteristics can be formed using the CVD method as described above, and the abrasion of the sleeve made of aluminum alloy can be suppressed sufficiently.

The invention also includes:

the process for producing a piston ring wherein a hard carbon film having a hydrogen content of 20 atm % or more and 30 atm % or less and having the ID/IG ratio between the peak area ID of the D band and the peak area IG of the G band in the Raman spectroscopic spectrum in a range of 0.5 or more and 2.0 or less is formed as the above-mentioned hard carbon film.

Since this kind of DLC film has sufficiently low friction properties, high abrasion resistance and low aggressiveness to a mating member as described above, a piston ring suitable for the sliding with a sleeve made of aluminum alloy can be obtained.

The invention also includes:
the process for producing a piston ring wherein
a metal layer or a metal nitride layer mainly containing any one metal selected from titanium, tungsten, chromium and silicon is formed as an adhesion layer prior to the forming of the hard carbon film, and then
the hard carbon film is formed using a cathode PIG plasma CVD method.

As described above, the adhesion layer has excellent adhesion properties for both the base member and the DLC film of the piston ring. A DLC film being excellent in adhesion properties can be formed by the cathode PIG plasma CVD method.

The invention includes:
a process for producing a piston ring having:
an adhesion layer forming step for forming, as an adhesion layer, a metal layer or a metal nitride layer mainly containing any one metal selected from titanium, tungsten, chromium and silicon on the surface of the piston ring made of nitrided stainless steel, cast iron, silicon-chromium steel or carbon steel by a sputtering method using a cathode PIG plasma CVD apparatus, and
a hard carbon film forming step for forming, on the surface of the piston ring on which the adhesion layer has been formed, a hydrogen-containing hard carbon film in which graphite microcrystals are dispersed, by a cathode PIG plasma CVD method by supplying hydrocarbon to the cathode PIG plasma CVD apparatus and by adjusting film forming time while a bias voltage is applied.

Since the piston ring produced using the above-mentioned producing process has sufficiently low friction properties, high abrasion resistance and low aggressiveness to a mating member, the piston ring can be adopted as a piston ring suitable for the sliding with a sleeve made of aluminum alloy.

Effect of the Invention

The present invention can provide a piston ring capable of sufficiently exhibiting low friction properties, high abrasion resistance and low aggressiveness to a mating member, required for the piston ring, even in the case that a sleeve made of aluminum alloy is used, and can also provide a process for producing the piston ring.

EMBODIMENTS FOR IMPLEMENTING THE INVENTION

An embodiment according to the present invention will be described below referring to the accompanying drawings.

In this embodiment, a piston ring is produced according to the following procedure.

1. Preparation of Base Member (Piston Ring)

First, a base member being formed into a predetermined piston ring shape is prepared. The base member is preferably made of nitrided stainless steel, cast iron, silicon-chromium steel or carbon steel, and is subjected to preliminary treatment, such as degreasing and cleaning, in advance.

2. Formation of Adhesion Layer

Next, an adhesion layer mainly consisting of Ti, W or Cr is formed on the surface of a piston ring serving as the base member. The adhesion layer is formed, for example, by a sputtering method using a cathode PIG plasma CVD apparatus that is also used to form a DLC film.

Figure 1:
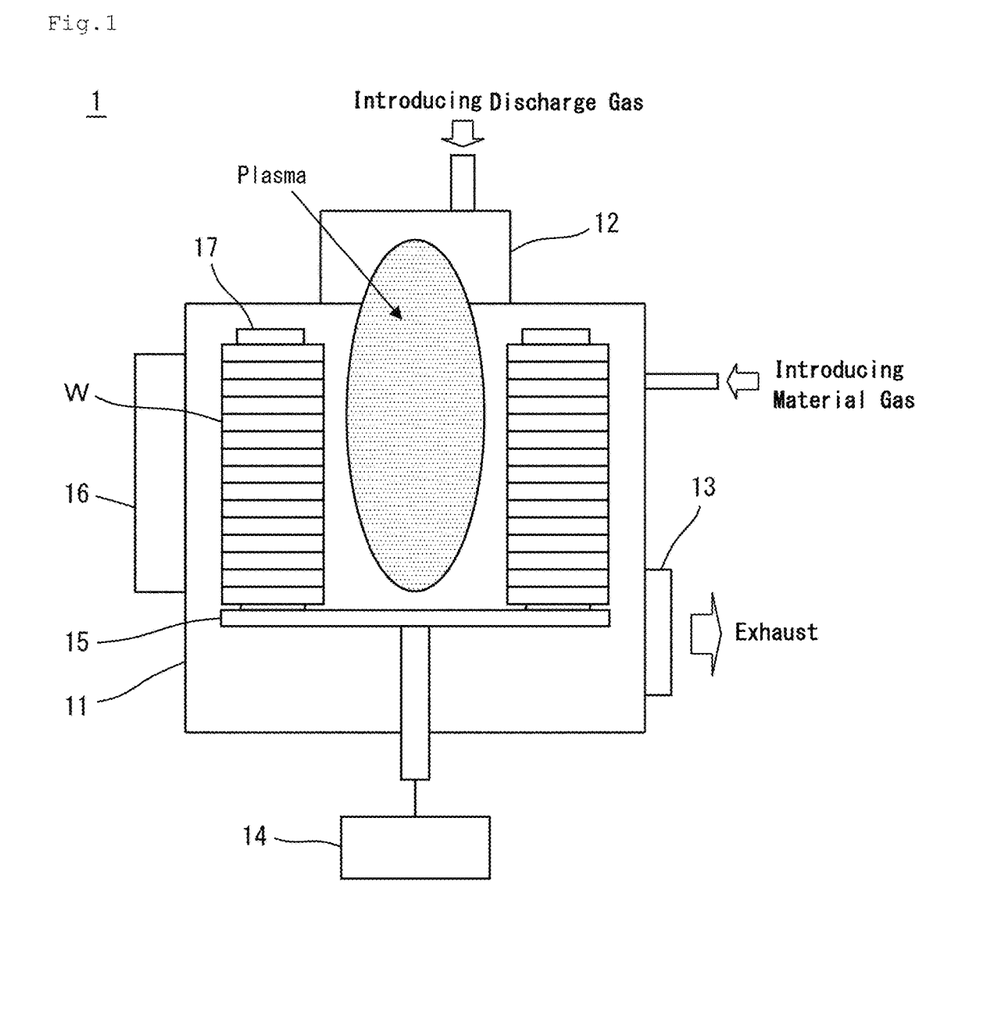
FIG. 1 is a view showing an outline of a cathode PIG plasma CVD apparatus to be used for an embodiment of the present invention.

FIG. 1 is a view showing an outline of the cathode PIG plasma CVD apparatus to be used for the embodiment. As shown in FIG. 1, the cathode PIG plasma CVD apparatus 1 is equipped with a film-forming chamber 11, a plasma chamber 12, an exhaust port 13, a pulse power source 14, an electrode 15, a Ti sputter source 16, and a piston ring holding jig 17. W designates the piston ring (base member).

First, the piston rings W having been degreased and cleaned are set on the piston ring holding jig 17 and then placed inside the film-forming chamber 11. The piston rings W and the piston ring holding jig 17 are electrically connected to the electrode 15, and pulse voltage is applied by the pulse power source 14.

After the plasma chamber 12 and the film-forming chamber 11 are evacuated via the exhaust port 13 using an exhaust pump, not shown in the drawings, argon (Ar) is introduced as a discharge gas into the plasma chamber 12, and the pressure inside the discharge chambers (the plasma chamber 12 and the film-forming chamber 11) is adjusted. The piston rings W are held on the piston ring holding jig 17 and revolve inside the film-forming chamber 11 while rotating on the axis thereof on the electrode 15 until a series of film-forming processing is completed.

Then, Ar plasma is generated by DC discharge between a hot filament and an anode, not shown in the drawings, inside the plasma chamber 12. The generated Ar plasma is transported into the film-forming chamber 11 by a transporting means, not shown in the drawings, and the surfaces of the piston rings W to which a bias voltage has been applied by the pulse power source 14 is irradiated with Ar ions, whereby cleaning is carried out by etching.

Next, the discharge inside the plasma chamber 12 is stopped, and Ti is sputtered from the Ti sputter source 16 under predetermined sputtering conditions, whereby a Ti film is formed on the surfaces of the piston rings W.

Although Ti is taken as an example in the above description, the above-mentioned W or Cr may also be used to form an adhesion layer in a similar way. Furthermore, Si can also be used, and moreover, an adhesion layer may also be formed of a nitride of each of the above-mentioned elements.

The thickness of the adhesion layer to be formed is preferably 0.1 to 1.0 μm.

3. Forming of DLC Film

Next, a hydrogen-containing DLC film in which graphite microcrystals are dispersed is formed on the surface of the adhesion layer using the cathode PIG plasma CVD apparatus.

At this time, it is preferable that a DLC film containing Si is formed between the adhesion layer and the hydrogen-containing DLC film as an intermediate layer. With this structure, the adhesion properties between the adhesion layer and the hydrogen-containing DLC film can be improved further.

The intermediate layer can be formed by supplying, for example, hydrocarbon, such as acetylene ($C_2H_2$) or methane ($CH_4$), and hydrogen ($H_2$) as material gas, together with a compound containing Si, such as tetramethylsilane (TMS) by a cathode PIG plasma CVD method using the cathode PIG plasma CVD apparatus.

The thickness of the intermediate layer to be formed is preferably 0.1 to 1.0 μm.

On the surface of the intermediate layer having been formed as described above, a hydrogen-containing DLC film is further formed by the cathode PIG plasma CVD method using the cathode PIG plasma CVD apparatus.

Specifically, hydrocarbon, such as $C_2H_2$ or $CH_4$, is supplied as material gas to the cathode PIG plasma CVD apparatus, and film forming time is adjusted while a bias voltage is applied, whereby a hydrogen-containing DLC film in which graphite microcrystals are dispersed can be formed.

4. Evaluation of Hydrogen-Containing DLC Film

The hydrogen-containing DLC film formed as described above is evaluated by the methods described below.

(1) Nanoindentation Hardness

Nanoindentation hardness is measured under a predetermined load using an indentation hardness meter. In the embodiment, film forming conditions are adjusted appropriately so that the measured nanoindentation hardness is approximately 20 to 30 GPa.

(2) Raman Spectroscopic Analysis (ID/IG Ratio)

Next, from the peak area ID of the D band and the peak area IG of the G band in the Raman spectroscopic spectrum obtained by Raman spectroscopic analysis, ID/IG ratio is obtained. In the embodiment, the film forming conditions are adjusted appropriately so that the measured ID/IG ratio is 0.5 or more and 2.0 or less.

Specifically, the waveform obtained by applying a laser beam having a wavelength of 532 nm is base-line corrected using the NRS-5100 made by JASCO Corporation and then split into the D band having a peak at about 1350 $cm^{-1}$ and the G band having a peak at about 1550 $cm^{-1}$ by curve fitting using a Gaussian function and a Lorenz function, and the ratio (the ID/IG ratio) between the area ID of the D band and the area IG of the G band is obtained. According to the ratio, it is possible to judge whether the DLC film is a DLC film having a Raman waveform typical of the hydrogen-containing DLC film.

(3) Hydrogen Content

Next, the hydrogen content in the formed hydrogen-containing DLC film is measured by the Rutherford back-scattering spectroscopy method (RBS method). In the embodiment, the film forming conditions are adjusted appropriately so that the measured hydrogen content is 20 atm % or more and 30 atm % or less, preferably, 23 atm % or more and 28 atm % or less.

(4) X-Ray Diffraction Measurement (Confirmation of Graphite Crystals)

The confirmation of the presence of graphite crystals in the formed hydrogen-containing DLC film and the confirmation of the diameter of the crystals are carried out by X-ray diffraction measurement described below.

Generally, a plurality of sharp diffraction peaks corresponding to respective lattice planes are present in the X-ray diffraction spectrum of a crystal material, and the structure of the crystals is determined by collating these peaks. On the other hand, in the case of the present invention, the diffraction peaks of the graphite crystals are present while being mixed with broadly scattered peaks referred to as a halo pattern being peculiar to amorphous materials.

Figure 2:
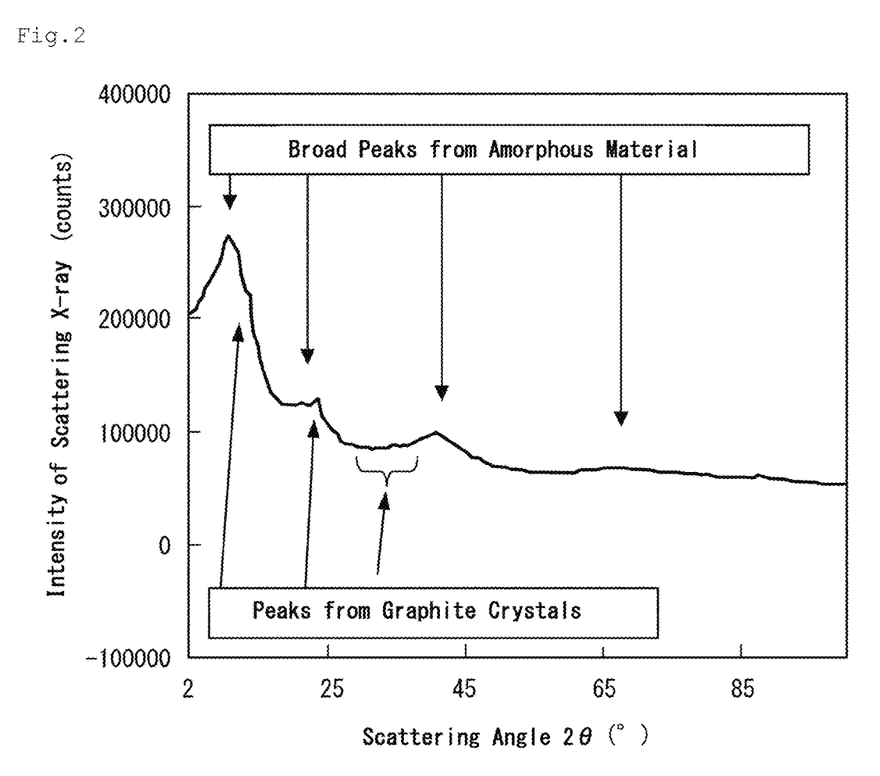
FIG. 2 is a graph showing a measurement example of the X-ray diffraction spectrum of the hydrogen-containing DLC film formed in an embodiment of the present invention.

FIG. 2 shows a measurement example of the X-ray diffraction spectrum of the hydrogen-containing DLC film formed in the embodiment. The measurement was conducted under the conditions that the X-ray source was a radiation light source; that the X-ray energy was 15 keV, that the incident slit width was 0.1 mm, that the detector was a scintillation counter (a solar slit was disposed at the front stage), that the measurement range of a scattering angle 2θ was 5 to 100°, that the measurement step was 0.1°, and that the integration time was 30 sec/step. The measurement was also conduced while a hard carbon film sample was peeled off from the base member and filled up in a thin glass tube (capillary).

Figure 3:
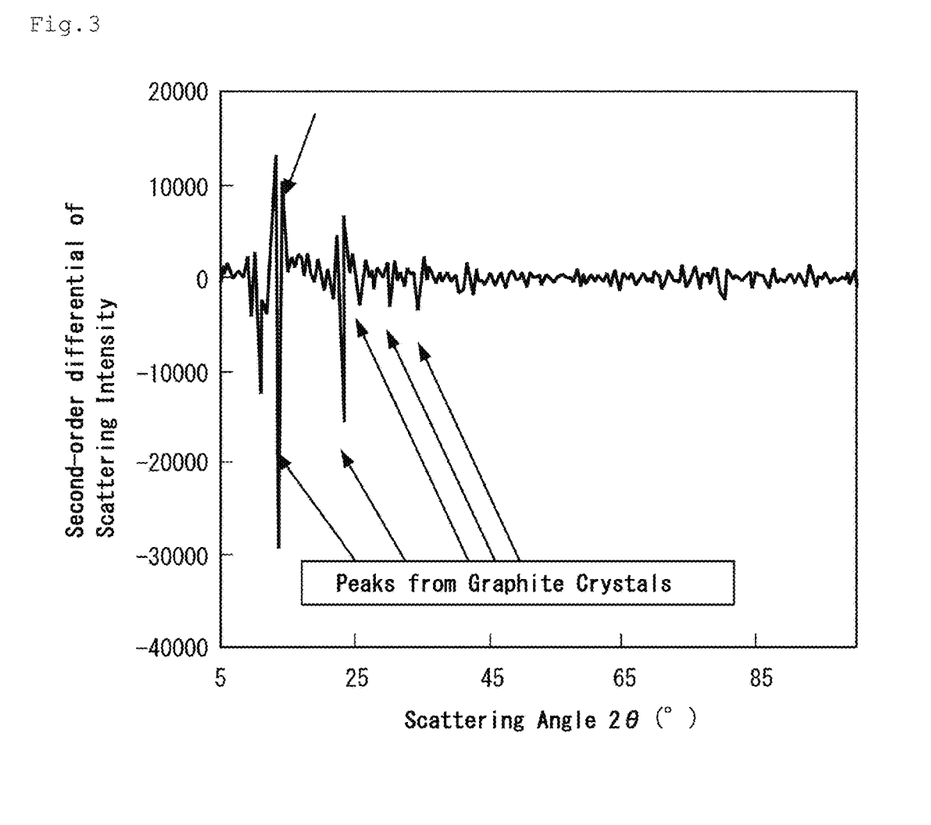
FIG. 3 is a graph showing the differential spectrum of the hydrogen-containing DLC film shown in FIG. 2.

As shown in FIG. 2, since the hydrogen-containing DLC film formed in the embodiment is amorphous, the diffraction peak intensity of the graphite crystals is relatively low in some cases. However, even in this case, the presence of main crystal peaks can be confirmed by using the differential spectrum having been used widely in analytical chemistry. FIG. 3 shows the differential spectrum of the hydrogen-containing DLC film shown in FIG. 2.

In the embodiment, 10 peaks being recognized in the differential spectrum and ranked in descending order of intensity were selected. If at least three peaks of them were located at the peak positions of the graphite crystals, it was specified that the hydrogen-containing DLC film contained graphite microcrystals. This way of thinking conforms to the Hanawalt method being used for the X-ray diffraction of general crystal materials, that is, a method in which a diffraction pattern is characterized on the basis of three peaks having the highest intensity.

Figure 4:
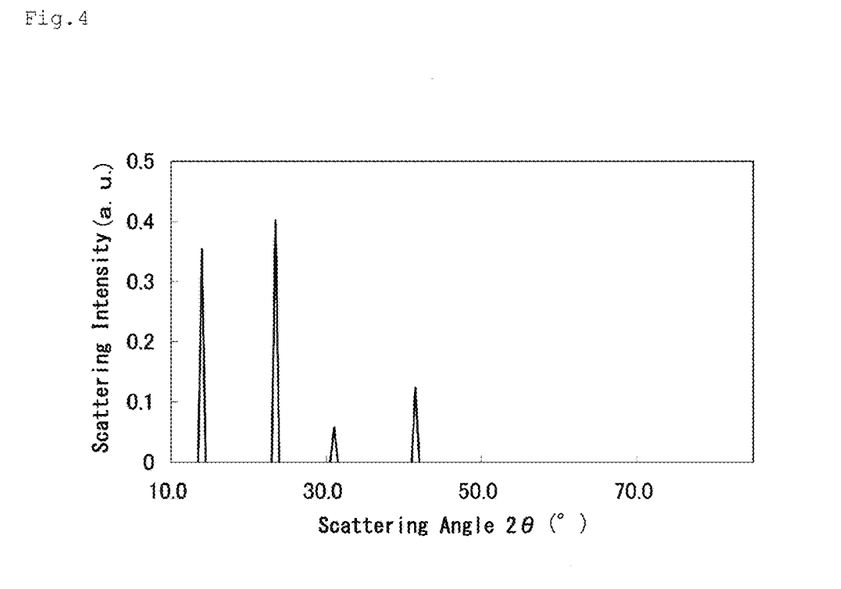
FIG. 4 is a graph showing the extracted crystal peaks of the hydrogen-containing DLC film shown in FIG. 2.

Furthermore, the diameter of the graphite microcrystals can be estimated from the spread of the above-mentioned diffraction peaks. Specifically, after graphite crystal peaks are extracted by subtracting the halo pattern due to amorphous portions as background from the X-ray scattering spectrum, the diameter can be obtained by applying the Scherrer equation described below. FIG. 4 shows the result obtained by extracting the graphite crystal peaks of the hydrogen-containing DLC film shown in FIG. 2.

$$D = (0.9 \times \lambda)/(\beta \times \cos\theta)$$

where D: crystal diameter (nm)
λ: the wavelength of X-ray (nm)
μ: the half value width of crystal peak (radian)
θ: the position of crystal peak 5. Evaluation of Piston Ring As a result of the evaluation of the piston ring produced as described above, it is found that the piston ring can sufficiently exhibit low friction properties, high abrasion resistance and low aggressiveness to a mating member, required for the piston ring, even in the case that the piston ring is slid with a sleeve made of an aluminum alloy.

Examples

The present invention will be described below more specifically on the basis of Examples.
1. Production of Piston Rings
(1) Preparation of Base Members (Piston Rings)
Base members (piston rings) made of nitrided stainless steel and measuring 81 mm in outer diameter and 1.2 mm in width were prepared by degreasing and cleaning.
(2) Forming of Adhesion Layer
The piston rings having been degreased and cleaned were set on the piston ring holding jig 17 in the cathode PIG plasma CVD apparatus 1 shown in FIG. 1 and then cleaned by etching.
Specifically, after the plasma chamber 12 and the film-forming chamber 11 were evacuated up to $2 \times 10^{-3}$ Pa, Ar was introduced at a flow rate of 50 cc/min, and the pressure inside the discharge chambers (the plasma chamber 12 and the film-forming chamber 11) was adjusted to 0.3 Pa. Next, Ar plasma was generated inside the plasma chamber 12 by a discharge current of 10 A and transported into the film-forming chamber 11. Then, a pulse voltage (bias voltage) of −500 V was applied by the pulse power source 14 to the piston rings W, the surfaces of the piston rings W was irradiated with the Ar ions and cleaning by etching was performed for 10 minutes.
Next, Ti was sputtered from the Ti sputter source 16, whereby an adhesion layer (under layer) was formed.
Specifically, an electric power of 6 kW was applied to a sputtering DC power source, not shown in the drawings, a bias voltage of −100 V was applied to the piston rings (base members), and at an Ar gas flow rate of 80 cc/min and a pressure of 0.4 Pa, Ti sputtering was carried out for 60 minutes, whereby a Ti film having a thickness of 0.5 μm was formed as an adhesion layer.
(3) Forming of DLC Film
(a) Forming of Intermediate Layer
Next, a DLC film containing Si was formed as an intermediate layer on the adhesion layer by the cathode PIG plasma CVD method.
Specifically, TMS was introduced at a flow rate of 60 cc/min and $C_2H_2$ was introduced at a flow rate of 150 cc/min from a material gas introducing port, and at a pressure of 0.4 Pa, a discharge current of 10 A and a bias voltage of −500 V were applied for 30 minutes to form a film, whereby a DLC film containing Si having a thickness of 0.5 μm was formed as an intermediate layer.
(b) Forming of DLC Film
Next, the film forming time was adjusted under each of the conditions described in Table 1, and a DLC film having a thickness of 5.0 μm was formed on the intermediate layer.

TABLE 1

| (Unit) | Ar flow rate cc/min) | Hydrocarbon gas | Hydrocarbon gas flow rate (cc/min) | Pressure (Pa) | Bias voltage (V) |
|---|---|---|---|---|---|
| Comparative example | 40 | $C_2H_2$ | 150 | 0.4 | −500 |
| Example 1 | 100 | $C_2H_2$ | 150 | 0.1 | −700 |
| Example 2 | 100 | $CH_4$ | 150 | 0.1 | −700 |

2. Evaluation of DLC Film
Each of the obtained DLC films was evaluated on the following items.
(1) Nanoindentation Hardness
Nanoindentation hardness was measured at a measurement load of 300 mgf using an indentation hardness meter (Nanoindenter ENT-1100a) manufactured by Elionix Inc. The results are shown in Table 2.
(2) Raman Spectroscopic Analysis
The ID/IG ratio was obtained on the basis of the above-mentioned method using the NRS-5100 manufacture by JASCO Corporation. The results are shown in Table 2.
(3) Hydrogen Content
The hydrogen content in each DLC film was measured using the RBS method. The results are shown in Table 2.

TABLE 2

| (Unit) | Nano-indentation hardness (GPa) | Raman spectroscopic analysis ID/IG area ratio | Hydrogen content (atm %) |
|---|---|---|---|
| Comparative example | 21 | 1.2 | 27 |
| Example 1 | 23 | 1.3 | 24 |
| Example 2 | 19 | 1.5 | 27 |

According to Table 2, it has been confirmed that all the DLC films obtained in Comparative example, Example 1 and Example 2 have a hydrogen content of 20 atm % or more to 30 atm % or less, that the DLC films have a hardness in the range from approximately 20 GPa to approximately 30 GPa, and that the DLC films have a Raman waveform typical of the hydrogen-containing DLC film (a-C:H film: hydrogenated amorphous carbon film).
(4) X-Ray Diffraction Measurement
The X-ray diffraction spectrum of each DLC film was obtained, and the presence of graphite microcrystals in the DLC film was analyzed, and the diameter of the crystals was confirmed.
In this measurement, in addition to the above-mentioned respective DLC films (a-C:H films) obtained by the cathode PIG plasma CVD method, four kinds of DLC films formed by using methods other than the cathode PIG plasma CVD method, more specifically, an a-C:H film formed by the sputtering method, two kinds of a-c:H(Me) films (metal-added hydrogenated amorphous carbon films), and a hydrogen-free ta-C film (tetrahedral amorphous carbon film) formed by an arc deposition method, were subjected to the X-ray diffraction measurement to obtain their X-ray diffraction spectra, and then the presence of graphite microcrystals was analyzed.
At this time, for the respective DLC films, the X-ray diffraction measurement was conducted under the conditions that the X-ray energy was 15 keV, that the scanning range (the measurement range of the scattering angle 2θ) of the detector was 5 to 140°, that the scanning step (measurement step) was 0.1°, and that the integration time was 20 sec/step. The respective DLC films were peeled off from the piston rings and filled up in the capillary.
As the result of the measurement, crystal peaks were detected only in the DLC films according to Example 1 and Example 2, whereby the presence of graphite crystals was confirmed. On the other hand, crystal peaks was unable to be confirmed in the other DLC film.
Furthermore, it was confirmed that the diameters of the graphite crystals in the DLC films according to Example 1 and Example 2 were in the range from 15 to 100 nm. The strains of the graphite microcrystals in the DLC films according to Example 1 and Example 2 were in the range from 0.4 to 0.8%.

(5) Surface Observation

Figure 5:
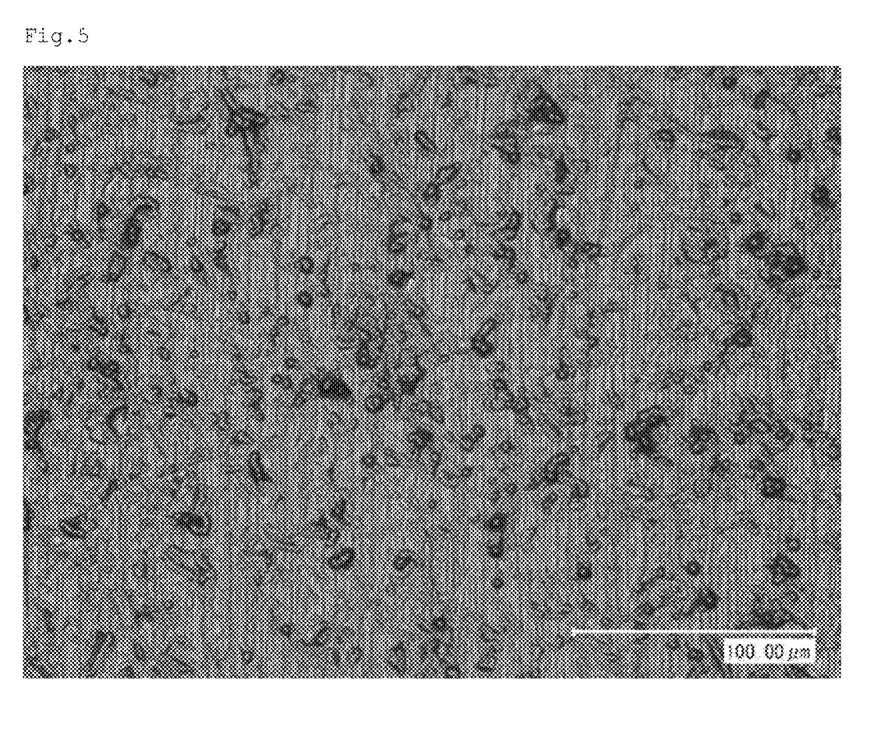
FIG. 5 is a microscopic photograph of the surface of a hydrogen-containing DLC film according to Example 1.

Next, the surfaces of the piston rings on which the respective DLC films according to Comparative example, Example 1 and Example 2 were formed were observed using the microscope VHX-1000 manufactured by Keyence Corporation. FIG. 5 shows a microscopic photograph of the surface of the DLC film according to Example 1, and FIGS. 6 and 7 show microscopic photographs of the surface of the DLC film according to Example 2.

Figure 6:
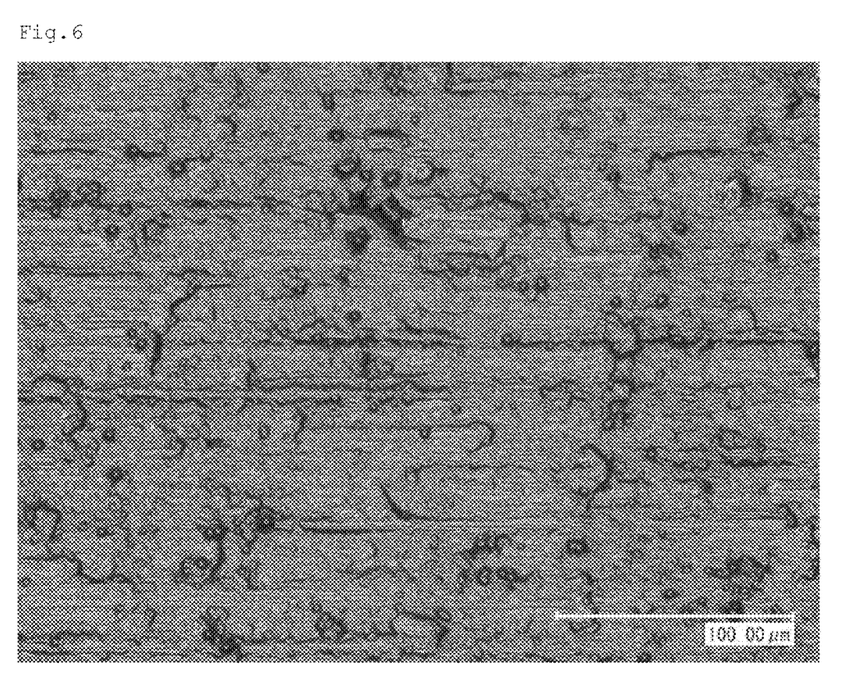
FIG. 6 is a microscopic photograph of the surface of a hydrogen-containing DLC film according to Example 2.
Figure 7:
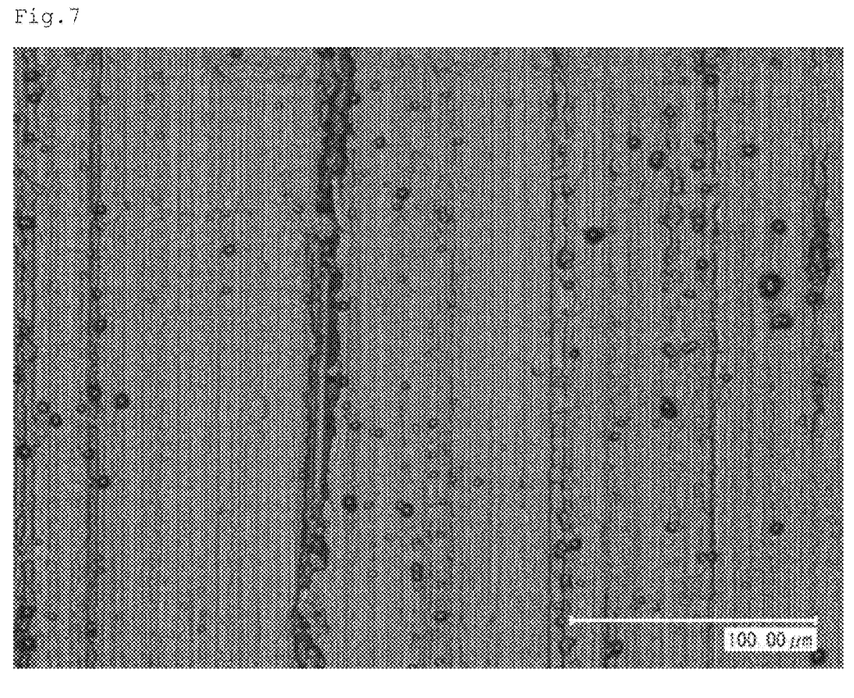
FIG. 7 is a microscopic photograph of the surface of the hydrogen-containing DLC film according to Example 2, taken from a different view.
Figure 8:
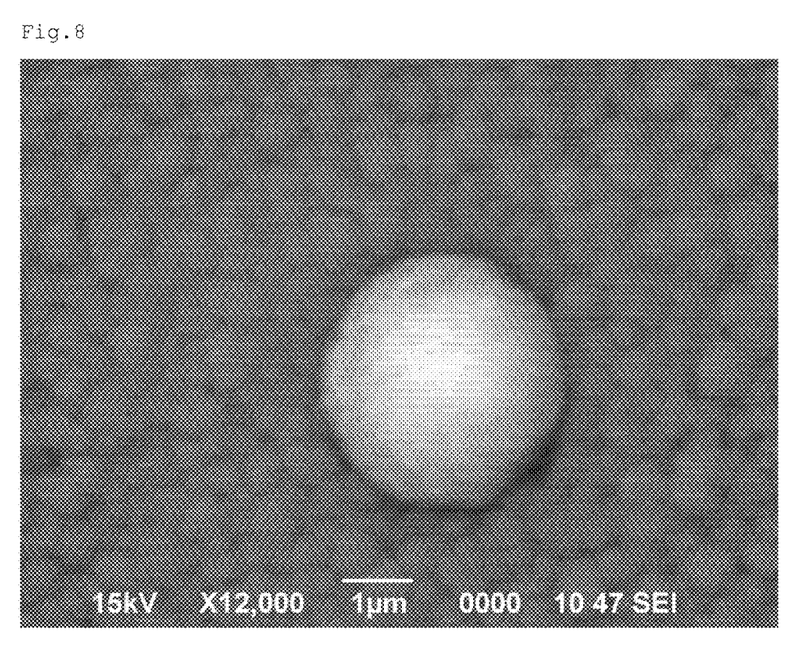
FIG. 8 is an electro-microscopic photograph of the surface of the hydrogen-containing DLC film, showing the presence of granular growth substances.

As shown in FIGS. 5 to 7, it is found that characteristic surfaces are formed on the DLC films according to Example 1 and Example 2 containing graphite microcrystals. Specifically, granular growth substances, as shown in the electromicroscopic photograph of FIG. 8, are dispersed. It has been confirmed that these granular substances have a size of approximately 1 to 6 μm and are dispersed at a density of approximately 300 to 4000 pcs/mm$^2$.

Since this size is approximately 10 times as large as that of graphite microcrystals, the inventors of the present invention presume that the granular substances have grown by using the graphite microcrystals as nuclei. The inventors also presume that, since the diameter of the granular substances is several micrometers, the granular substances frequently make contact with the mating member and the abrasion of the DLC film is suppressed.

3. Evaluation of Sliding Characteristics

Next, the characteristics of the sliding between each of the piston rings on which the DLC films formed under the different film forming conditions described in Table 3 and a sleeve made of aluminum alloy were evaluated. A hydrogen-containing ta-C:H film (hydrogenated tetrahedral amorphous carbon film) formed by the arc deposition method was also formed as a DLC film. Furthermore, in this evaluation, the characteristics of the sliding between a sleeve made of cast iron and a piston ring on which a CrN film was formed and the characteristics of the sliding between a sleeve made of aluminum alloy and a piston ring on which a CrN film was formed were also evaluated.

(1) Evaluation Method

Figure 9:
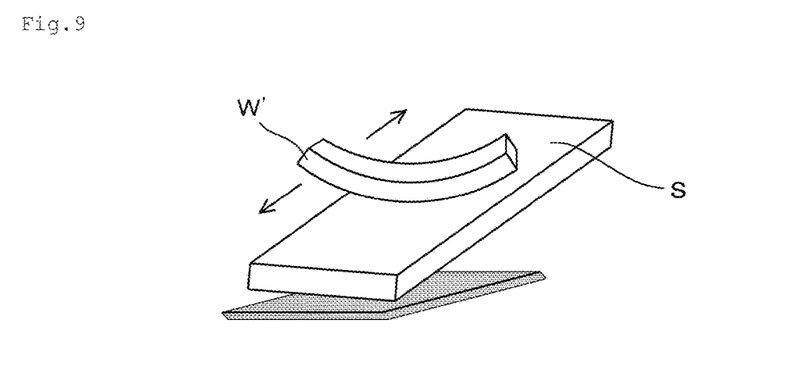
FIG. 9 is a schematic perspective view showing a method of evaluating the sliding characteristics of a piston ring.

Specifically, a sleeve cutout piece S cut out into a flat plate shape from each of the sleeves prepared under the respective conditions described in Table 3 is slid, as shown in FIG. 9, with a piston ring test piece W' cut out into an arcuate shape from each of the piston rings on which films are formed under the respective conditions described in Table 3, and the abrasion amounts of the piston ring test piece W' and the sleeve cutout piece S were measured.

The sleeve made of aluminum alloy, shown in Table 3, composed of Al-17Si-2Cu-1Mg-1Fe-0.4Mn (wt %) and having a hardness of Hv122 to 125, was made by using a die casting method. The piston rings made of nitrided stainless steel were used.

In the sliding test, as shown in FIG. 9, the sliding face (arcuate outer circumferential face) of the piston ring test piece W' was made contact with the sleeve cutout piece S and slid reciprocally under the reciprocating sliding conditions described below, and the abrasion amounts of the piston ring test piece W' and the sleeve cutout piece S were measured.

(Reciprocating Sliding Conditions)
Lubricating oil: base oil
Load: 60 N
Speed: 600 cpm
Time: 10 min
Temperature: 120° C.

(2) Result of Evaluation

Table 3 shows the results of the evaluation.

TABLE 3

| Sleeve material | Film type | Method | DLC type | Ring abrasion amount (μm) | Sleeve abrasion amount (μm) |
|---|---|---|---|---|---|
| Aluminum alloy | CrN | Arc deposition | — | 1.40 | 1.88 |
| | DLC | Sputtering | a-C:H not containing graphite microcrystals | 0.32 | 0.95 |
| | | Arc deposition | ta-C: | 1.31 | 4.72 |
| | | Arc deposition | ta-C:H | 1.65 | 2.20 |
| | | CVD | a-C:H (Me) | 1.49 | 3.20 |
| | | PIG (Comparative example) | a-C:H not containing graphite microcrystals | 0.22 | 0.54 |
| | | PIG (Example 1) | a-C:H containing graphite microcrystals | 0.06 | 0.51 |
| | | PIG (Example 2) | a-C:H containing graphite microcrystals | 0.11 | 0.29 |
| Cast iron | CrN | Arc deposition | — | 2.46 | 0.67 |

According to Table 3, first, in the case that the sleeve is made of cast iron mainly used as a sleeve material at present (the piston ring is coated with CrN), it is found that the abrasion amount of the sleeve is relatively small, 0.67 μm. However, in the case that the sleeve material is replaced with aluminum alloy, adhesive abrasion occurs between the aluminum alloy and the film on the piston ring, and it is found that the abrasion amount of the sleeve increases nearly three times to 1.88 μm.

Hence, in the case that the coating films on the piston rings are replaced with DLC films hardly adhesive to aluminum alloy, since the ta-C film and the ta-C: H film (hydrogenated tetrahedral amorphous carbon film) are far higher in hardness than aluminum alloy, aggressive abrasion is promoted, and the abrasion amounts of the sleeves have not decreased but increased.

The abrasion amount of the sleeve in the case of the piston ring on which the a-C:H film is formed by the sputtering method can be made smaller than those in the cases of the piston rings on which the ta-C film and the ta-c:H film are formed. However, the abrasion amount is approximately 1.5 times the abrasion amount of the above-mentioned sleeve made of cast iron and is still large.

Since the metal-added a-c:H (Me) film causes adhesive abrasion with Si in aluminum alloy, the abrasion amount of the sleeve has also increased.

On the other hand, in the cases of the a-C:H films (Comparative example, Example 1 and Example 2) formed using the cathode PIG plasma CVD method, both the abrasion amounts of the sleeves and the abrasion amounts of the DLC films (the abrasion amounts of the rings) are smaller than those in the case of the sleeve made of cast iron. Hence, the piston rings coated with the a-C:H films can be favorably used as piston rings for the sleeve made of aluminum alloy.

The abrasion amount of the DLC film (the abrasion amount of the ring) obtained in Comparative example is 0.2 µm, and considering the use of the piston ring for a long time, the DLC film having a thickness of approximately 10 µm is required to be provided on the surface of the piston ring. Thicker the film becomes, more time is required for surface treatment, and the manufacturing cost of the piston ring increases. In addition, if the film becomes thicker, the stress in the film becomes larger, and the risk of peeling off of the film increases.

On the other hand, in Example 1 and Example 2 in which graphite microcrystals are dispersed, the abrasion amounts of the sleeves are decreased so as to be equal to or less than that of the sleeve made of cast iron, and the abrasion amounts of the DLC films (the abrasion amounts of the rings) are also decreased sufficiently to 0.06 and 0.11 µm, respectively, in comparison with the case of the sleeve made of cast iron. In the case of the abrasion amounts of the DLC films in the range from 0.06 to 0.11 µm, the thickness of the DLC films required to be provided on the surfaces of the piston rings is approximately 3 to 5 µm. Hence, the manufacturing cost of the piston rings decreases remarkably, and the risk of peeling off of the films decreases sufficiently, unlike the case of Comparative example described above.

Figure 10:
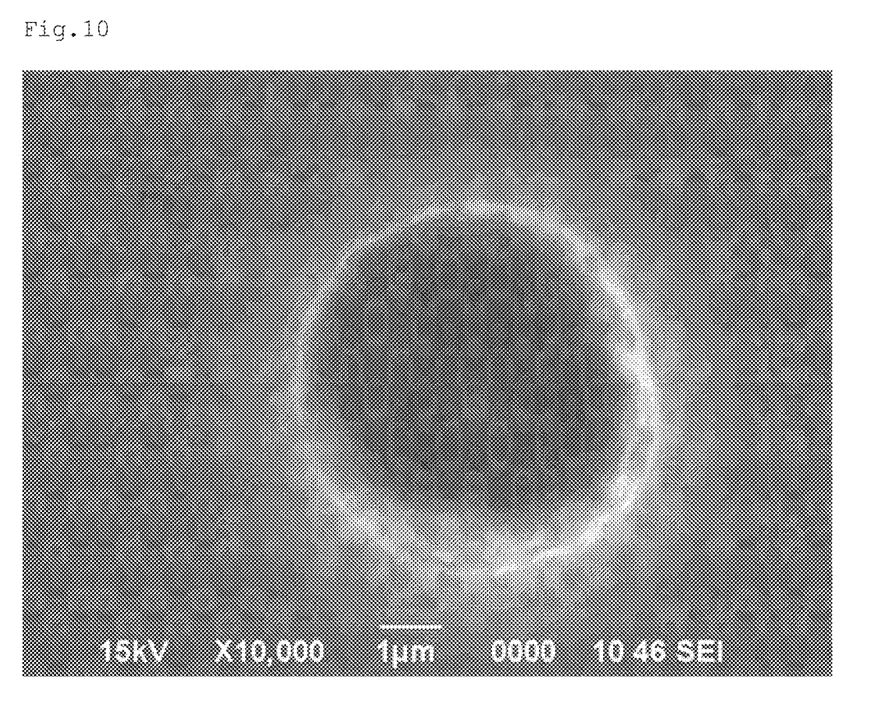
FIG. 10 is an electro-microscopic photograph of the surface of the piston ring from which granular growth substances have dropped after a sliding test.
Figure 11:
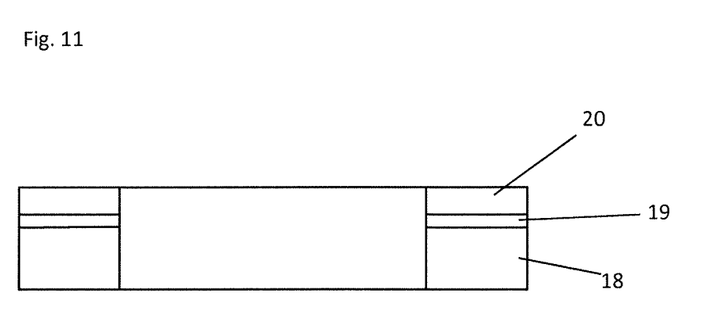
FIG. 11 is a cross sectional view of a piston depicting the various layers.

AS shown in FIG. 10 showing an electro-microscopic photograph of the surface of the piston ring test piece W' after the sliding test, numerous dents, caused by the dropping of the granular growth substances having been present on the surface before the sliding, are found after the sliding test. It is assumed that, in the case that the sliding is carried out at an excessive surface pressure, the granular growth substances drop and the aggressiveness to and the abrasion against the mating member are suppressed.

FIG. 4 is a cross section view of the piston ring. The end sections show the base member 18, the adhesion member 19 which is a metal layer and the hard carbon film 20.

Although the present invention has been described above on the basis of the embodiment, the present invention is not limited to the above-mentioned embodiment. The above-mentioned embodiment can be modified variously within the range identical and equivalent to that of the present invention.

DESCRIPTION of the REFERENCE SIGNS 1 cathode PIG plasma CVD apparatus
11 film-forming chamber
12 plasma chamber
13 exhaust port
14 pulse power source
15 electrode
16 Ti sputter source
17 piston ring holding jig
18 base member
19 adhesion layer
20 hard carbon film
S sleeve cutout piece
W piston ring (base member)
W' piston ring test piece

What is claimed is:

1. A piston ring, on the uppermost surface of which a hard carbon film is formed, the uppermost surface being used as a face sliding with a sleeve made of aluminum alloy,
   wherein the hard carbon film has graphite crystal peaks in the X-ray diffraction pattern thereof,
   wherein a range of hydrogen content of the hard carbon film is 20-30 atm %,
   wherein a diameter of the graphite microcrystals is 15 to 100 nm,
   wherein a metal layer or a metal nitride layer mainly containing any one metal selected from titanium, tungsten, chromium and silicon is formed as an adhesion layer on the lower surface of the hard carbon film,
   wherein the hard carbon film is formed by a cathode PIG plasma CVD method,
   wherein the hard carbon film is formed by adjusting film forming conditions such that nanoindentation hardness is 20 to 30 GPa, and
   wherein the hard carbon film is so formed such that granular substances having a size of approximately 1 to 6 µm are dispersed at a density of 300 to 4000 pcs/mm$^2$ on a surface thereof.

2. The piston ring according to claim 1, wherein a peak area ID of a D band and a peak area IG of a G band in the Raman spectroscopic spectrum are adjusted so that an ID/IG ratio is between 0.5 and 2.0.

3. A process for producing a piston ring having a sliding face sliding with a sleeve made of aluminum alloy on the surface thereof,
   forming a hard carbon film having graphite crystal peaks in the X-ray diffraction pattern thereof on the uppermost surface of the sliding face,
   forming a metal layer or a metal nitride layer mainly containing any one metal selected from titanium, tungsten, chromium and silicon as an adhesion layer on the lower surface of a hard carbon film,
   forming the hard carbon film by a cathode PIG plasma CVD method,
   adjusting film forming conditions such that the hard carbon film has a nanoindentation hardness of 20 to 30 GPa, and
   forming the hard carbon film such that granular substances having a size of approximately 1 to 6 µm are dispersed at a density of 300 to 4000 pcs/mm$^2$ on a surface thereof
   wherein a range of hydrogen content of the hard carbon film is 20-30 atm %,
   wherein a diameter of the graphite microcrystals is 15 to 100 nm.

4. The process for producing a piston ring according to claim 3, further comprising adjusting an ID/IG ratio between a peak area ID of a D band and a peak area IG of a G band in the Raman spectroscopic spectrum so that an ID/IG ratio is between 0.5 and 2.0.

* * * * *